(12) United States Patent
Fujita et al.

(10) Patent No.: US 11,296,191 B2
(45) Date of Patent: Apr. 5, 2022

(54) POWER MODULE AND POWER CONVERTER

(71) Applicant: HITACHI, LTD., Tokyo (JP)

(72) Inventors: Ryuusei Fujita, Tokyo (JP); Naoki Watanabe, Tokyo (JP); Yuan Bu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 681 days.

(21) Appl. No.: 16/319,140

(22) PCT Filed: Oct. 2, 2017

(86) PCT No.: PCT/JP2017/035785
§ 371 (c)(1),
(2) Date: Jan. 18, 2019

(87) PCT Pub. No.: WO2018/066496
PCT Pub. Date: Apr. 12, 2018

(65) Prior Publication Data
US 2021/0351271 A1    Nov. 11, 2021

(30) Foreign Application Priority Data
Oct. 6, 2016   (JP) .............................. JP2016-197865

(51) Int. Cl.
| *H01L 29/16* | (2006.01) |
| *H01L 25/07* | (2006.01) |
| *H01L 29/739* | (2006.01) |
| *H01L 29/861* | (2006.01) |

(52) U.S. Cl.
CPC ........ *H01L 29/1608* (2013.01); *H01L 25/072* (2013.01); *H01L 29/7393* (2013.01); *H01L 29/861* (2013.01)

(58) Field of Classification Search
CPC .............. H01L 29/1608; H01L 29/072; H01L 29/7393; H01L 29/861
USPC ....................................................... 257/788
See application file for complete search history.

(56) References Cited

U.S. PATENT DOCUMENTS

| 2015/0138733 A1 | 5/2015 | Tsuda et al. |
| 2016/0197155 A1 | 7/2016 | Hiyoshi |

FOREIGN PATENT DOCUMENTS

| JP | 2007-281090 A | 10/2007 | |
| JP | 2013-149798 A | 8/2013 | |
| JP | 2013-191716 A | 9/2013 | |
| JP | 2016-127177 A | 7/2016 | |
| WO | 2014/030254 A1 | 2/2014 | |
| WO | 2016/103434 A1 | 6/2016 | |
| WO | 2016/111127 A1 | 7/2016 | |
| WO | WO-2018066496 A1 * | 4/2018 | ........... H01L 29/868 |

* cited by examiner

*Primary Examiner* — Igwe U Anya
(74) *Attorney, Agent, or Firm* — Miles & Stockbridge, P.C.

(57) ABSTRACT

Dielectric breakdown resistance of a power module including a SiC-IGBT and a SiC diode is improved. The power module includes a SiC-IGBT 110 and a SiC diode 111, and a film thickness of a resin layer 323 covering an upper portion of an electric field relaxation region 320 of the SiC-IGBT 110 is larger than a chip thickness of the SiC-IGBT 110, that is, for example, 200 µm or more.

7 Claims, 7 Drawing Sheets

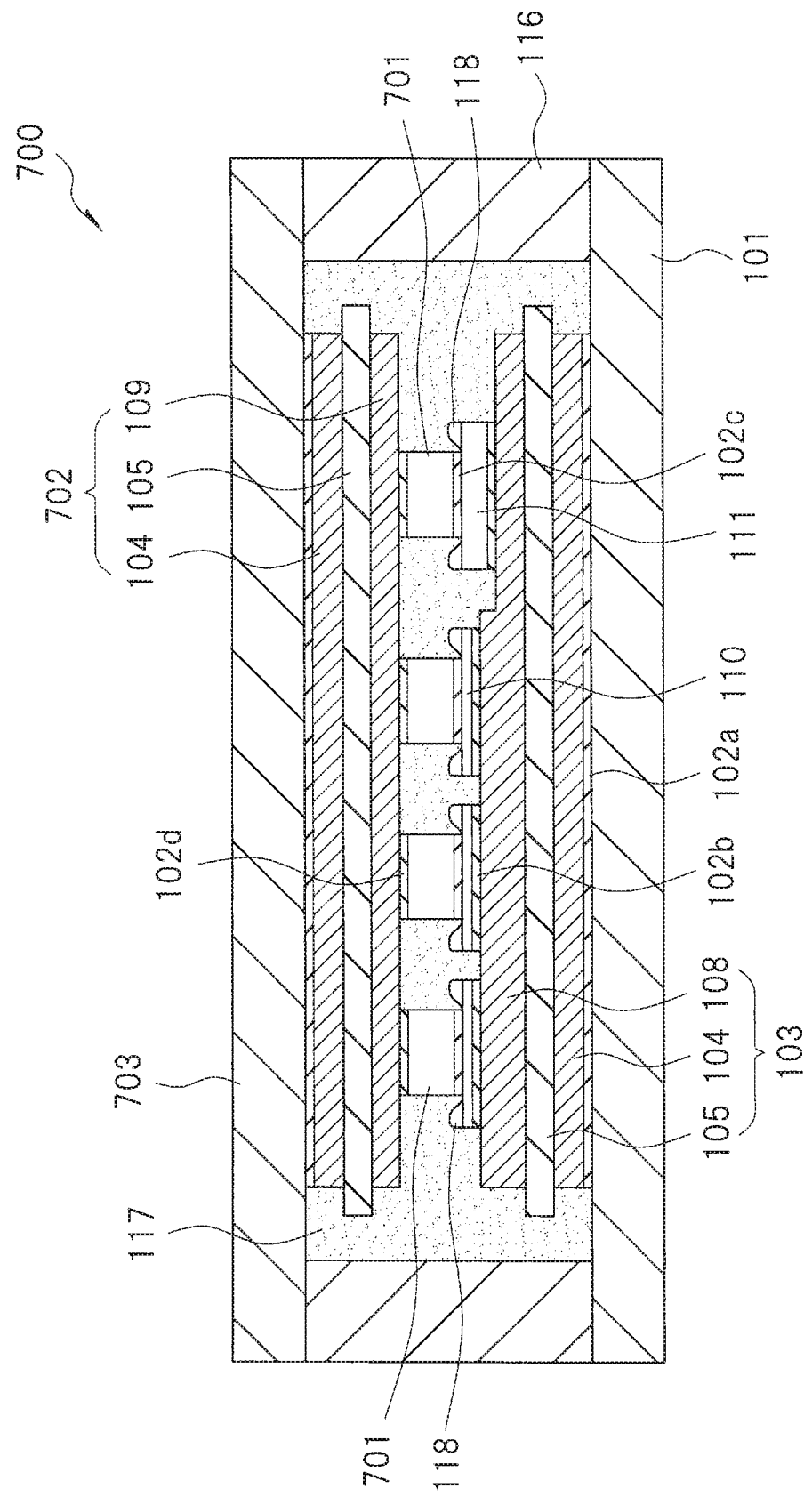

POWER MODULE AND POWER CONVERTER

TECHNICAL FIELD

The present invention relates to a power module including a silicon carbide (SiC)-IGBT and a SiC diode, for example, to a power module suitable for use in a power converter incorporated in a driving system of an automobile or a railroad vehicle.

BACKGROUND ART

As a switching device of a power converter, a chip of a semiconductor device that handles a high voltage and a large current is mounted on a power module.

Conventionally, a silicon (Si) has been widely used as a substrate material of this type of semiconductor device. In addition, for example, in the case of a large capacity load such as a railroad vehicle driving equipment, an insulated gate bipolar transistor (IGBT) is used as a switching device from the viewpoint of withstand voltage and current capacity.

Meanwhile, in recent years, research and development of a semiconductor device using, as a material, a wide bandgap semiconductor such as SiC that is a compound semiconductor has been advanced. SiC has dielectric breakdown electric field strength that is about one order of magnitude larger than that of Si. Therefore, device resistance can be theoretically reduced by three digits or more by thinning a drift layer that maintains the withstand voltage by about 1/10 and increasing impurity concentration by about 100 times. Further, since the bandgap is about three times larger than that of Si, high-temperature operation is also possible. For example, an IGBT using SiC as a substrate material (hereinafter referred to as SiC-IGBT), which can secure a high withstand voltage of 6.5 kV or more and can reduce electrical resistance during conduction, and a diode also using SiC as a substrate material (hereinafter referred to as SiC diode) have been under development.

Although the IGBT has a P-channel structure and an N-channel structure, it is advantageous in terms of performance to adopt the N-channel structure as a SiC-IGBT. In the case of adopting the N-channel structure, although a P-type collector is used, it is difficult to obtain a P-type SiC substrate, and thus a collector P layer is formed on an N-type substrate. In addition, since a collector electrode is formed under the collector P layer, it is necessary to grind the back surface of the N-type substrate.

The power module on which the SiC-IGBT is mounted includes a SiC diode as a free-wheeling device. Since the SiC diode can form a cathode electrode under the N-type substrate, it is not necessary to grind the N-type substrate unlike the case of the SiC-IGBT.

As described above, SiC has an advantage in that the dielectric breakdown electric field strength is about 10 times as large as that of Si, the resistance is lowered by a thickness of the drift layer being thinned, and the cost can be reduced by an electric field relaxation region being reduced. However, since the electric field around the chip also becomes strong when the high voltage is applied, the risk of dielectric breakdown around the chip inside the power module increases.

In view of the above, in the power module using SiC as a substrate material, measures have been taken to prevent dielectric breakdown by sealing a semiconductor device and a wiring pattern around the chip with a silicone gel or the like.

PTL 1 discloses a technique for improving dielectric breakdown strength of a silicone gel in a SiC power module in which an electric field relaxation region around a chip is covered with a silicone gel by laminating, between the electric field relaxation region and the silicone gel, an inorganic layer made of a silicone oxide and a resin layer having a permittitity equal to or less than that of the inorganic layer and equal to or more than that of the silicone gel.

CITATION LIST

Patent Literature

PTL 1: JP 2013-191716 A

SUMMARY OF INVENTION

Technical Problem

In a case where the SiC-IGBT is mounted in the power module, since a chip thickness of the SiC-IGBT is small, it is influenced by a high electric potential wiring pattern, and the electric field strength increases. Accordingly, dielectric breakdown tends to occur, and the power module is broken in the worst case.

In the power module disclosed in PTL 1, the inorganic layer and the resin layer are provided between the electric field relaxation region and the silicone gel around the chip so that the dielectric breakdown strength of the silicone gel is improved, thereby reducing the maximum electric field strength in the silicone gel.

However, when the withstand voltage required for the power module further increases in the future, there is no guarantee against the influence of the electric field generated from the wiring pattern in such measures. Especially in the case of a thin chip such as in the SiC-IGBT, the electric field of equal to or more than a design value may be generated, whereby it is necessary to take measures to improve dielectric breakdown resistance of the power module by further reducing the electric field strength in the silicone gel.

The above and other objects and novel features of the present invention will become apparent from the descriptions of the present specification and the accompanying drawings.

Solution to Problem

Among embodiments disclosed in the present application, the outline of a representative will be briefly described as follows.

A power module according to a representative embodiment includes a SiC-IGBT and a SiC diode, and a film thickness of a first resin layer that covers a surface of a first substrate on which the SiC-IGBT is formed is made larger than a film thickness of a second resin layer that covers a surface of a second substrate on which the SiC diode is formed.

Advantageous Effects of Invention

According to the representative embodiment, dielectric breakdown resistance of the power module including the SiC-IGBT and the SiC diode can be improved.

BRIEF DESCRIPTION OF DRAWINGS

FIG. 1(b) is a cross-sectional view taken along line B-B of FIG. 1(a).

FIG. 3(b) is a cross-sectional view of a chip edge portion of a SiC-IGBT included in a part of the power module illustrated in FIGS. 1(a) and 1(b).

FIG. 7 is a cross-sectional view of a power module according to a third embodiment of the present invention.

DESCRIPTION OF EMBODIMENTS

Figure 1:
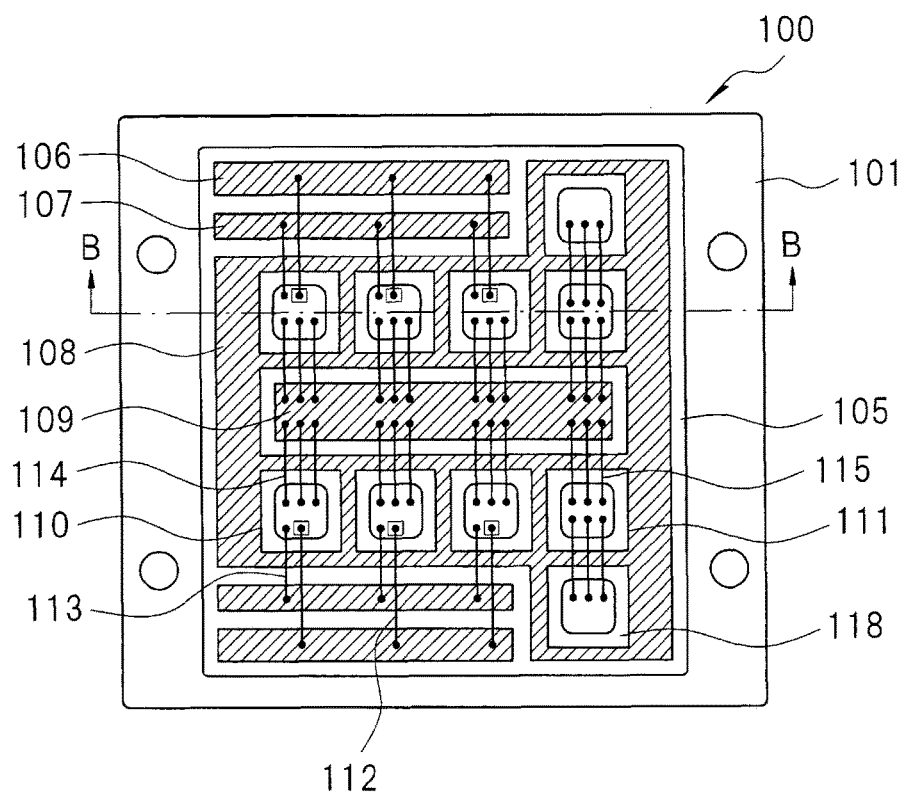
FIGS. 1(a) and 1(b) are plan views of a power module according to a first embodiment of the present invention.
Figure 1:
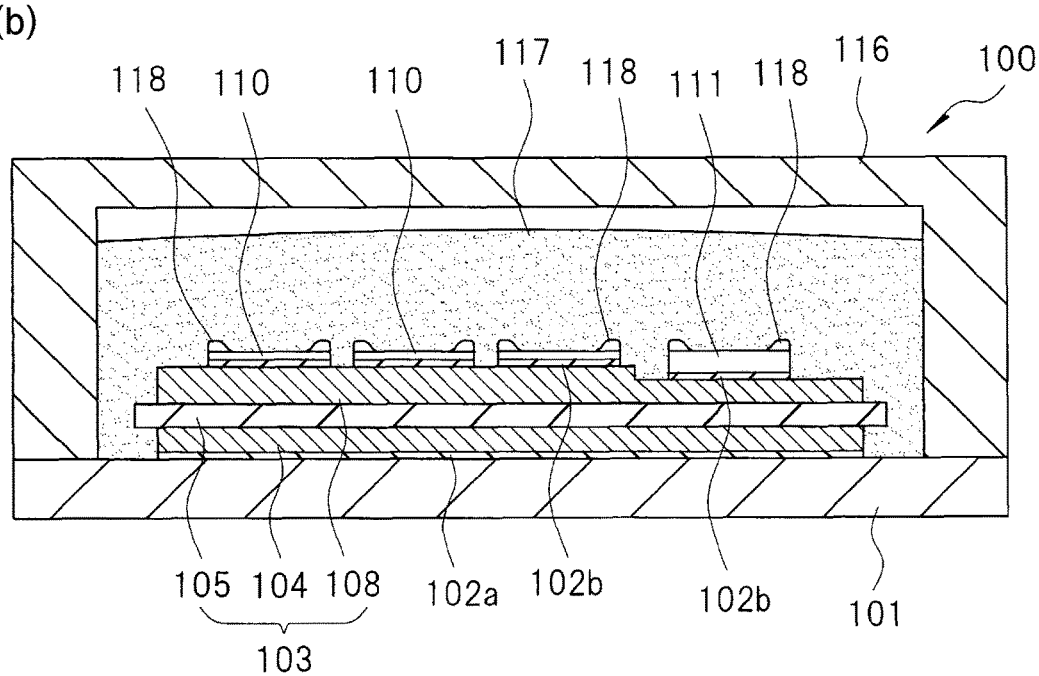

Hereinafter, embodiments of the present invention will be described with reference to the accompanying drawings. Note that, in all the drawings for describing the embodiments, members having the same functions are denoted by the same reference signs, and duplicate descriptions thereof will be omitted. In addition, in the embodiments, descriptions of the same or similar parts will not be repeated basically unless it is particularly necessary. Furthermore, in the drawings for describing the embodiments, hatching may be applied even in a plan view or hatching may be omitted even in a cross-section view in some cases to make configurations easy to understand.

First Embodiment

FIG. 1(a) is a plan view of a power module according to a first embodiment, and FIG. 1(b) is a cross-sectional view taken along line B-B of FIG. 1(a).

A power module 100 according to the present embodiment includes a heat radiation base 101 at the bottom, and an insulating substrate 103 is joined to the heat radiation base 101 via solder 102a. The insulating substrate 103 includes a metal pattern 104 for heat radiation, and an insulating layer 105 stacked on the metal pattern 104. On the insulating layer 105, a gate wiring pattern 106, an emitter sense wiring pattern 107, a collector wiring pattern 108, and an emitter wiring pattern 109 are formed.

Further, a SiC-IGBT 110 and a SiC diode 111 are joined onto the collector wiring pattern 108 via solder 102b, and a collector electrode of the SiC-IGBT 110 and a cathode electrode of the SiC diode 111 are electrically short-connected. Note that the SiC-IGBT 110 and the SiC diode 111 may also be joined onto the collector wiring pattern 108 via a sintered metal (not illustrated).

In the example illustrated in FIGS. 1(a) and 1(b), the number of the insulating substrate 103 mounted on the heat radiation base 101 is one, the number of the SiC-IGBT joined onto the collector wiring pattern 108 is six, and the number of the SiC diode is four. By increasing the number of the insulating substrate 103, the SiC-IGBT 110, and the SiC diode 111 according to the current capacity required for a power converter, the current capacity of the power module 100 can be increased. Furthermore, the current capacity of the power converter can also be increased by connecting a plurality of power modules 100 in parallel.

Each of the SiC-IGBTs 110 joined onto the collector wiring pattern 108 is electrically connected to the gate wiring pattern 106 via a gate wire 112, electrically connected to the emitter sense wiring pattern 107 via an emitter sense wire 113, and electrically connected to the emitter wiring pattern 109 via an emitter wire 114.

The gate wiring pattern 106 common to respective SiC-IGBTs 110 on the insulating substrate 103, the common emitter sense wiring pattern 107, the common collector wiring pattern 108, and the common emitter wiring pattern 109 are used, whereby the respective SiC-IGBTs 110 on the insulating substrate 103 are connected in parallel.

Meanwhile, each of the SiC diodes 111 is electrically connected to the emitter wiring pattern 109 via an anode wire 115. Further, an anode electrode of the SiC diode 111 is electrically short-connected with an emitter electrode of the SiC-IGBT 110.

An external terminal (not illustrated) is joined to, by ultrasonic joining or the like, the gate wiring pattern 106, the emitter sense wiring pattern 107, the collector wiring pattern 108, and the emitter wiring pattern 109 on the insulating substrate 103, whereby the terminal is led out of the power module 100.

An exterior case 116 is fixed to the heat radiation base 101 at the bottom of the power module 100, and the inside of the exterior case 116 is filled with a silicone gel 117 to cover the entire insulating substrate 103. Further, resin layers 118 are applied on respective surfaces of the SiC-IGBT 110 and the SiC diode 111 along the outer periphery of a chip.

A chip thickness of the SiC-IGBT 110 is smaller than a chip thickness of the SiC diode 111 since back surface grinding of a substrate is required in manufacturing a device. In view of the above, in the present embodiment, the resin layer 118 is applied onto the SiC-IGBT 110 to be thicker than the resin layer 118 applied onto the SiC diode 111 so that the electric field strength in the vicinity of the chip edge portion of the SiC-IGBT 110 is reduced, thereby preventing dielectric breakdown of the silicone gel 117.

Figure 2:
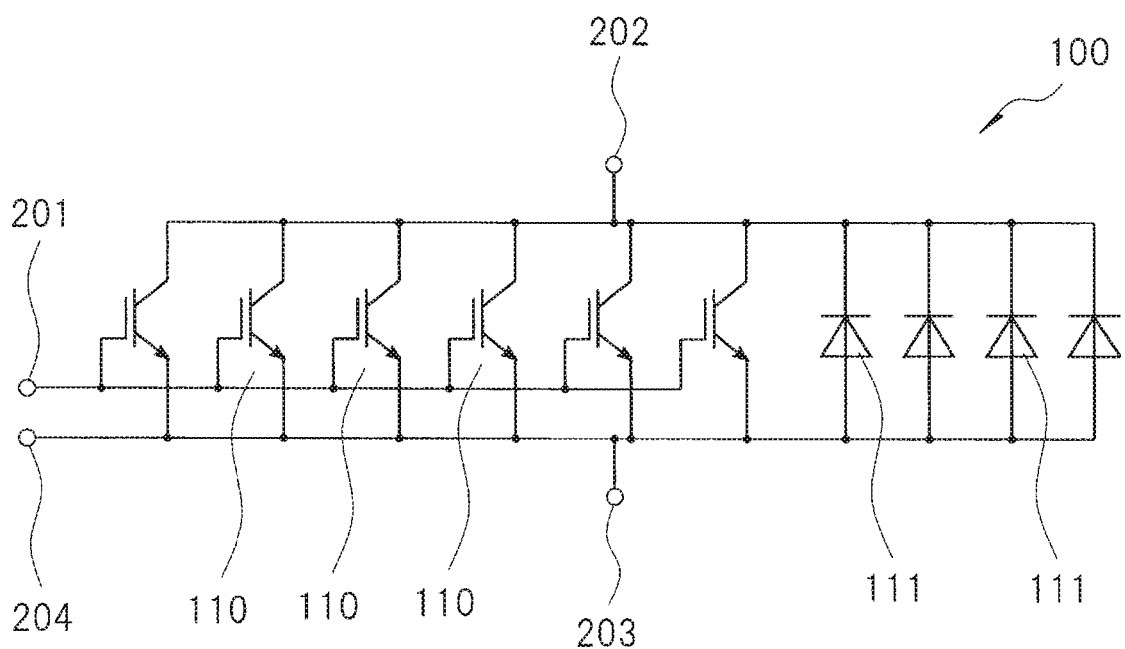
FIG. 2 is a circuit diagram of the power module illustrated in FIG. 1.

FIG. 2 is a circuit diagram of the power module 100 illustrated in FIGS. 1(a) and 1(b). In the power module 100 illustrated in FIG. 2, each gate electrode of the six SiC-IGBTs 110 is electrically connected to a gate terminal 201, each collector electrode is electrically connected to a collector terminal 202, and each emitter electrode is electrically connected to an emitter terminal 203 and an emitter sense terminal 204. The emitter terminal 203 is electrically connected to a main circuit device outside the power module 100, and the emitter sense terminal 204 is also electrically connected to a control device or the like outside the power module 100. Meanwhile, each cathode electrode of the four SiC diodes 111 is electrically connected to the collector terminal 202, and each anode electrode is electrically connected to the emitter terminal 203 and the emitter sense terminal 204.

Figure 3:
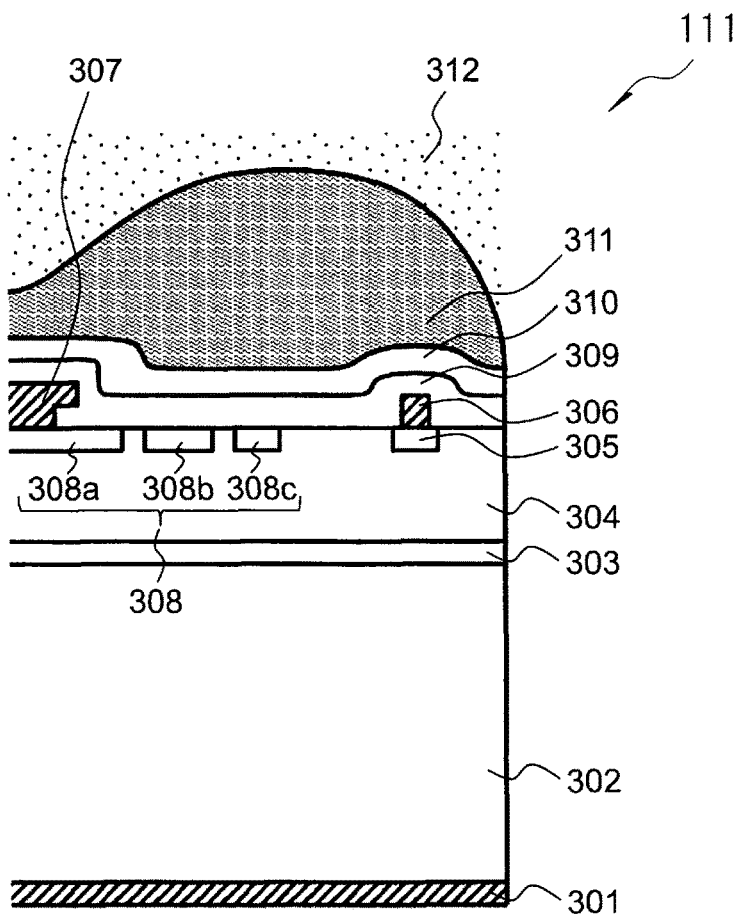
FIGS. 3(a) and 3(b) are cross-sectional views of a chip edge portion of a SiC diode included in a part of the power module illustrated in FIGS. 1(a) and 1(b)
Figure 3:
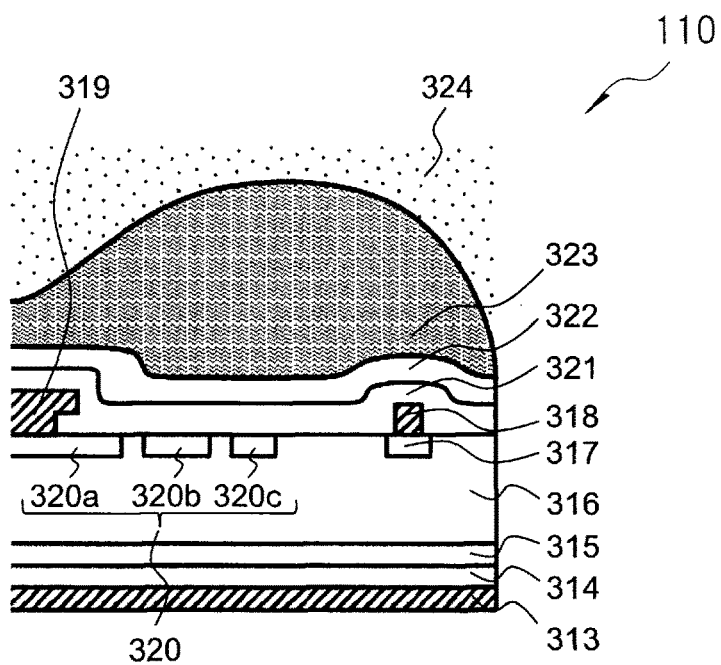

FIG. 3(a) is a cross-sectional view of the chip edge portion of the SiC diode 111, and FIG. 3(b) is a cross-sectional view of the chip edge portion of the SiC-IGBT 110.

In the SiC diode 111 illustrated in FIG. 3(a), an N substrate layer 302 is in contact with a cathode electrode 301, an N+ buffer layer 303 is formed on the N substrate layer 302, and an N− layer 304 that secures withstand voltage is formed on the N+ buffer layer 303. The N+ buffer layer 303 and the N− layer 304 are formed on the N substrate layer 302 by epitaxial growth. A thickness of the N substrate layer 302 is about 350 µm, for example, and a thickness of the N− layer 304 is about 70 µm, for example.

A channel stopper N region 305 and a channel stopper electrode 306 for suppressing electric field leakage to a side surface of the chip are formed at the chip edge portion on the surface of the N− layer 304. Further, an electric field relaxation region 308 is formed on the surface of the N− layer 304 on the side of an anode electrode 307. The electric field relaxation region 308 includes a P region 308a, a P region 308b, and a P region 308c. A width of the P region 308a near the anode electrode 307 is made the largest, and widths of the P region 308b and the P region 308c away from the anode electrode 307 are narrowed in that order.

An insulating layer 309 made of a silicone oxide film or the like is formed on the surface of the N− layer 304, a protective film 310 made of a polyimide resin or the like is formed on the insulating layer 309, and a resin layer 311 is formed on the protective film 310. A polyamide-imide resin or the like is mainly used as the resin layer 311. Further, the chip surface and the chip side surface are covered with a silicone gel 312. Since the thickness of the whole chip of the SiC diode 111 is mostly occupied by the N substrate layer 302 and the N− layer 304, the chip thickness of the SiC diode 111 is about 420 µm.

In the SiC-IGBT 110 illustrated in FIG. 3(b), a collector P layer 314 is in contact with a collector electrode 313. An N buffer layer 315 is formed on the collector P layer 314, and an N− layer 316 that secures withstand voltage is formed on the N buffer layer 315. Since a P-type SiC substrate is difficult to obtain, it is necessary to form the collector electrode 313 under the collector P layer 314, and to grind the N substrate layer to produce the device structure on the N− layer 316. Accordingly, the collector P layer 314, the N buffer layer 315, and the N− layer 316 are formed on an N substrate (not illustrated) by epitaxial growth. A thickness of the N− layer 316 is about 150 µm, and a chip thickness of the SiC-IGBT 110 is, since there is no N substrate layer, about 150 µm, which is substantially equal to that of the N− layer 316.

In a similar manner to the SiC diode 111, a channel stopper N region 317, a channel stopper electrode 318, an emitter electrode 319, an electric field relaxation region 320, an insulating layer 321, a protective film 322, and a resin layer 323 are formed on the surface of the N− layer 316, and the chip surface and the chip side surface are covered with a silicone gel 324. In the present embodiment, from the viewpoint of preventing dielectric breakdown of the silicone gel 117, a film thickness of the resin layer 323 is made larger than the chip thickness of the SiC-IGBT 110, that is, specifically, 200 µm or more.

In the power module 100, the cathode electrode 301 of the SiC diode 111 is electrically short-connected with the collector electrode 313 of the SiC-IGBT 110, and the anode electrode 307 of the SiC diode 111 is electrically short-connected with the emitter electrode 319 of the SiC-IGBT 110.

When a voltage is applied to the collector terminal in a state where the SiC-IGBT 110 is turned off, a potential difference is generated between the cathode electrode 301 and the anode electrode 307 of the SiC diode 111 and also between the collector electrode 313 and the emitter electrode 319 of the SiC-IGBT 110. The withstand voltage is secured by the N− layers 304 and 316 and the electric field relaxation regions 308 and 320 inside the chip. Further, on the chip surface, a strong electric field is generated particularly on the electric field relaxation regions 308 and 320. Since the electric field is the strongest in the insulating layers 309 and 321, the electric field relaxation regions 308 and 320 are designed such that dielectric breakdown does not occur in the insulating layers 309 and 321. Since the electric field is weakened in the protective films 310 and 322 and the resin layers 311 and 323 than that of the insulating layers 309 and 321, there is no risk of occurrence of dielectric breakdown. Although the electric field is further weakened in the silicone gel 312 and 324, since dielectric breakdown electric field strength of the silicone gel 312 and 324 is ¹⁄₁₀ or less of that of the resin layers 311 and 323, dielectric breakdown may occur in the silicone gel 312 and 324 in a case where the film thickness of the resin layers 311 and 323 is not sufficient.

Figure 4:
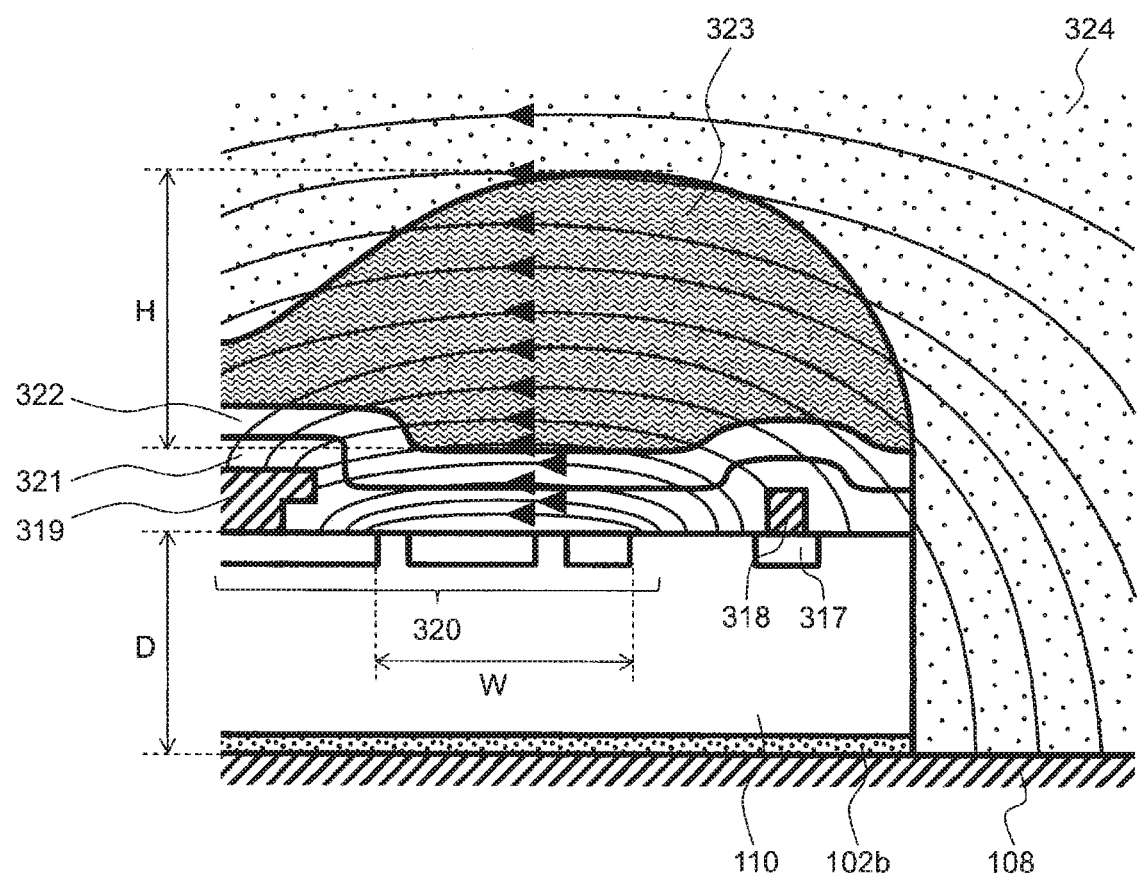
FIG. 4 is a schematic diagram illustrating lines of electric force generated on the chip of the SiC-IGBT included in a part of the power module illustrated in FIGS. 1(a) and 1(b).

FIG. 4 is a schematic diagram illustrating lines of electric force generated on the chip of the SiC-IGBT 110.

When a voltage is applied between the collector and the emitter of the SiC-IGBT 110, the collector electrode 313 and the channel stopper electrode 318 have a high potential while the emitter electrode 319 has a low potential, whereby an electric field is generated from the high potential portion to the low potential portion. The electric field is divided into those directed from the vicinity of the channel stopper electrode 318 and those directed from the collector wiring pattern 108, and both are directed toward the low potential portion across the electric field relaxation region 320. The density of the lines of electric force represents the magnitude of the electric field strength, and the electric field is strong on the electric field relaxation region 320 where the lines of electric force are concentrated. The intensity of the electric field directed from the vicinity of the channel stopper electrode 318 is determined by the illustrated dimension W, and the wider the width thereof becomes, the weaker the electric field becomes. The intensity of the electric field directed from the collector wiring pattern 108 is determined by the dimension W and a chip thickness D of the SiC-IGBT 110. The wider the dimension W becomes and the larger the chip thickness D becomes, the weaker the electric field becomes.

In a case where the chip thickness D is 400 µm or more like the SiC diode 111, the influence of the electric field directed from the collector wiring pattern 108 is small, and only the electric field directed from the vicinity of the channel stopper electrode 318 is considered in the design of the electric field relaxation region 320. However, since the chip thickness D of the SiC-IGBT 110 is about 150 µm, the influence of the electric field directed from the collector wiring pattern 108 becomes large, whereby the electric field exceeding the design value may be generated to eventually cause dielectric breakdown. In this case, although the electric field can be reduced by widening the dimension W, the number of chips that can be manufactured per wafer decreases, thereby increasing the manufacturing cost.

As a method for avoiding such a situation, as in the present embodiment, a film thickness H of the resin layer 323 is made larger and the region exceeding the dielectric breakdown electric field strength of the silicone gel 324 is covered with the resin layer 323, whereby dielectric breakdown can be prevented. In a case where the dimension W is 500 µm, the film thickness H of the resin layer 323 needs to be about 200 µm without considering the electric field directed from the collector wiring pattern 108. In practice, a film thickness larger than this is needed since the electric field directed from the collector wiring pattern 108 is also added. It is difficult to calculate the electric field considering the electric field directed from the collector wiring pattern 108. In a case where the film thickness H of the resin layer 323 is smaller than the chip thickness D of the SiC-IGBT 110, dielectric breakdown highly likely occurs in the silicone gel 324. Therefore, by setting the film thickness H of the resin layer 323 to be equal to or more than the chip thickness D of the SiC-IGBT 110 as in the present embodiment, the maximum value of the electric field in the silicone gel 324 is reduced, and dielectric breakdown can be prevented.

When the SiC-IGBT 110 is turned on, although conduction is established between the collector electrode 311 and the emitter electrode 317, loss arising from electrical resistance occurs. A part of the electrical resistance is the N− layer 316, and the loss can be reduced by thinning it. In the present embodiment, the N− layer 316 mostly occupying the chip thickness of the SiC-IGBT 110 is set to 150 µm. However, about 70 µm is sufficient to secure the withstand voltage of 6.5 kV. Although about 150 to 200 µm is required from the viewpoint of mechanical strength in device manufacturing, if the problem of the mechanical strength can be avoided, a low-loss power module can be provided by thinning the N− layer 316. While the loss is lowered by thinning the N− layer 316, the influence of the electric field exerted from the collector wiring pattern is increased, whereby dielectric breakdown tends to occur. Therefore, by applying the structure according to the present embodiment, dielectric breakdown hardly occurs, and it becomes possible to achieve both low loss and high withstand voltage.

Figure 5:
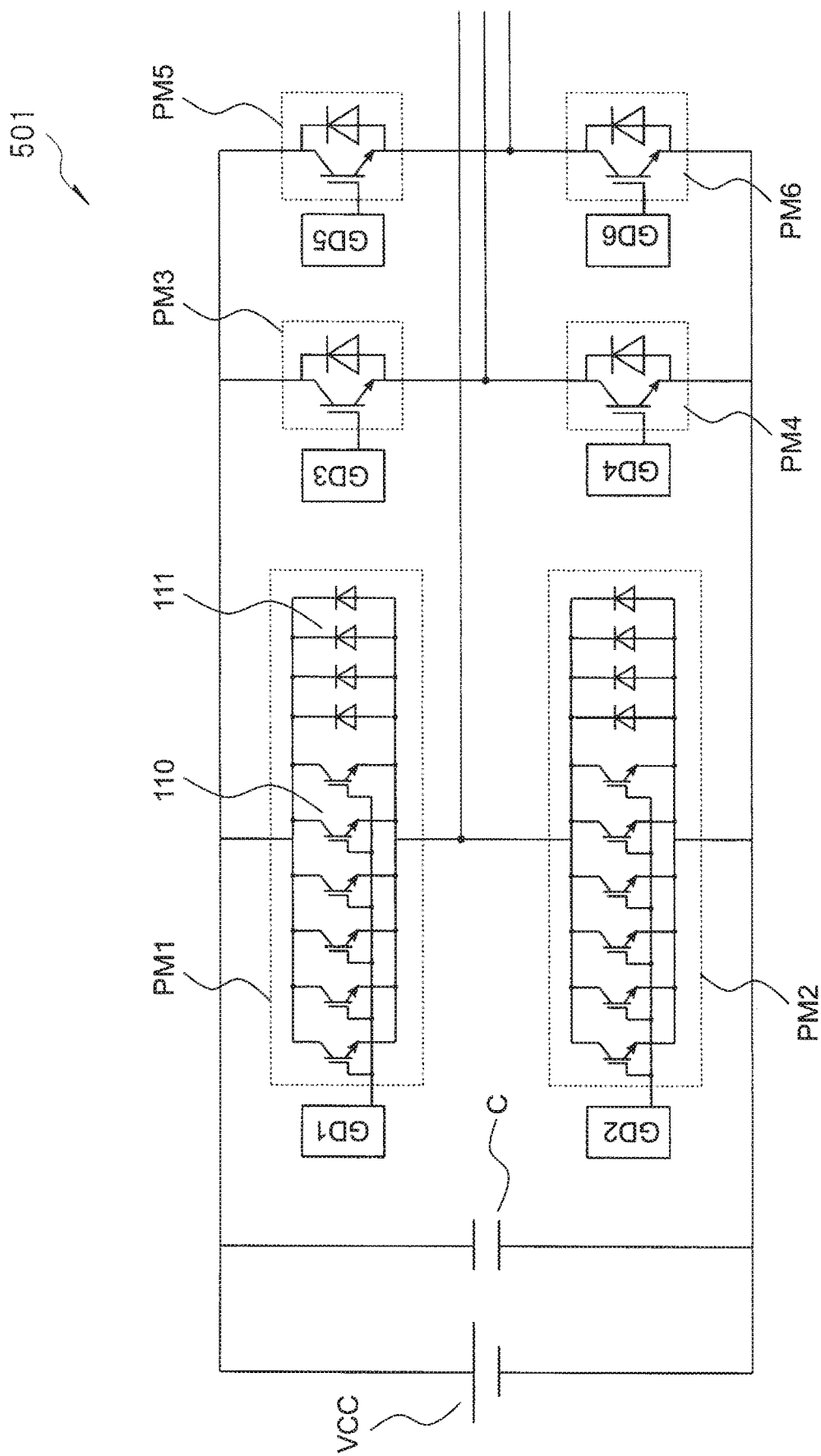
FIG. 5 is a circuit diagram of a power converter including the power module illustrated in FIGS. 1(a) and 1(b).

FIG. 5 is a circuit diagram of the power converter including the power module 100 according to the present embodiment described above.

A power converter 501 includes power module groups PM1 to PM6, and a capacitor C for stabilizing supplied power supply voltage VCC. Although an inductor is not illustrated in FIG. 5, in a case where a load has inductance, the inductance of the load can be used.

Each of the power modules PM1 to PM6 is configured by connecting a plurality of SiC-IGBTs 110 and the SiC diode 111 in parallel. Note that the power modules PM3 to PM6 are illustrated by representing one SiC-IGBT 110 and one SiC diode 111 to simplify the drawing. The cathode electrode of the SiC diode 111 is electrically short-connected with the collector electrode of the SiC-IGBT 110, and the anode electrode is electrically short-connected with the emitter electrode. Gate drive circuits GD1 to GD6 are gate drive circuits that drive respective power modules PM1 to PM6.

The power modules PM1 to PM6 are repeatedly turned on and off on the basis of signals output from the gate drive circuits GD1 to GD6. There are three pairs of two power modules connected in series, which are connected in parallel with the power supply voltage VCC. Wiring is connected to a load (not illustrated) from a connection point between switching device groups of each pair.

The two power modules connected in series (e.g., PM1 and PM2) are not turned on simultaneously. When the power module PM1 is turned off, the power module PM2 is turned on after a certain period of time called a dead time has elapsed. During the dead time period, a current flows through the SiC-IGBT of the power module PM1 or the SiC diode of the power module PM2 according to the direction of a load current. The same applies to the power modules PM3 and PM4 and the power modules PM5 and PM6.

The power converter 501 converts DC power into three-phase AC power, and supplies it to a load (not illustrated). In a case where any one or more of the power modules PM1 to PM6 is broken due to internal dielectric breakdown or the like, the power converter 501 cannot supply power suitable for the load. In the power converter 501 according to the present embodiment, the power modules PM1 to PM6 stably operate by the above-described electric field strength reduction effect, whereby high reliability can be achieved.

Second Embodiment

Figure 6:
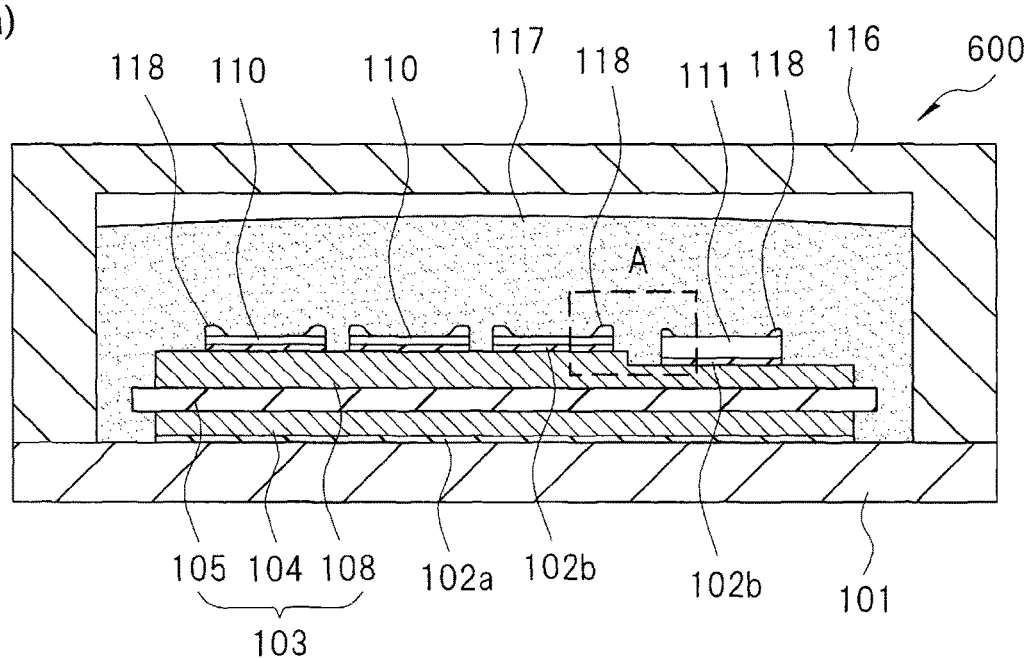
FIGS. 6(a) and 6(b) are cross-sectional views of a power module according to a second embodiment of the present invention.
Figure 6:
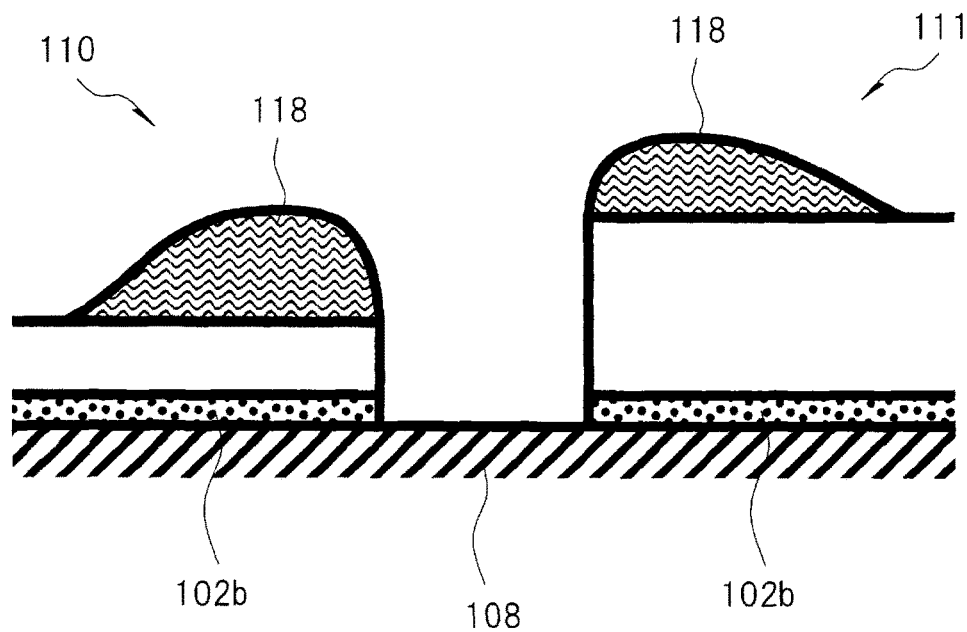

FIG. 6(a) is a cross-sectional view of a power module according to a second embodiment, and FIG. 6(b) is an enlarged view of a region surrounded by the dotted line A in FIG. 6(a).

A power module 600 according to the present embodiment is different from the power module 100 according to the first embodiment in that a film thickness of a resin layer 118 on a SiC diode 111 is made thinner than a film thickness of the resin layer 118 on a SiC-IGBT 110.

As described above, a chip thickness of the SiC diode 111 is larger than that of the SiC-IGBT 110. Therefore, in a case where the film thickness of the resin layer 118 is equal between the SiC-IGBT 110 and the SiC diode 111, an electric field in a silicone gel 117 becomes stronger in the SiC-IGBT 110.

The film thickness of the resin layer 118 can be reduced by decreasing a coating amount or increasing a coating speed. By setting the film thickness of the resin layer 118 on the SiC diode 111 to the minimum necessary as in the present embodiment, the effects of electric field reduction in the silicone gel 117, reliability improvement by the reduced risk of peel-off or a crack of the resin layer 118, cost reduction by the reduced coating amount, throughput improvement by the increased coating speed, and the like can be obtained.

Third Embodiment

FIG. 7 is a cross-sectional view of a power module according to a third embodiment.

A power module 700 according to the present embodiment is different from the power module 100 according to the first embodiment in that a step is provided in a collector wiring pattern 108 to equalize heights of an upper end portion of a SiC-IGBT 110 and an upper end portion of a SiC diode 111, and a second insulating substrate 702 and a second heat radiation base 703 are provided by disposing an emitter wiring pattern 109 on an upper side of a chip via a spacer 701.

Portions between the SiC-IGBT 110 and the spacer 701, between the SiC diode 111 and the spacer 701, between the spacer 701 and the second insulating substrate 702, and between the second insulating substrate 702 and the second heat radiation base 703 are joined via solder 102c, 102d, and 102e.

According to the present embodiment, heat generated in the SiC-IGBT 110 and the SiC diode 111 is also transferred to the second heat radiation base 703, and can be dispersed from both upper and lower surfaces, whereby heat radiation efficiency can be improved. Further, by providing a step in the collector wiring pattern 108 to equalize the heights of the upper end portion the SiC-IGBT 110 and the upper end portion of the SiC diode 111, all the spacers 701 can be in the same shape.

In the present embodiment, the emitter wiring pattern 109 is disposed on the upper side, whereby the electric field in the vertical direction directed from the collector wiring pattern 108 to the emitter wiring pattern 109 is generated. Therefore, in a case where the height of the spacer 701 is not sufficient, this electric field may exceed dielectric breakdown electric field strength of a silicone gel 117. In order to prevent such a situation, it is preferable to set the height of the spacer 701 to 600 μm or more.

Although the invention made by the present inventors has been concretely described on the basis of the embodiments thereof, the present invention is not limited to the embodiments mentioned above, and various modifications may be made without departing from the gist of the present invention.

REFERENCE SIGNS LIST 100 power module
101 heat radiation base
102a, 102b solder
103 insulating substrate
104 metal pattern
105 insulating layer
106 gate wiring pattern
107 emitter sense wiring pattern
108 collector wiring pattern
109 emitter wiring pattern
110 SiC-IGBT
111 SiC diode
112 gate wire
113 emitter sense wire
114 emitter wire
115 anode wire
116 exterior case
117 silicone gel
118 resin layer
201 gate terminal
202 collector terminal
203 emitter terminal
204 emitter sense terminal
301 cathode electrode
302 N substrate layer
303, 315 N+ buffer layer
304, 316 N− layer
305, 317 channel stopper N region
306, 318 channel stopper electrode
307, 319 anode electrode
308, 320 electric field relaxation region
308a, 308b, 308c, 320a, 320b, 320c P region
309, 321 insulating layer
310, 322 protective film
311, 323 resin layer
312, 324 silicone gel
313 collector electrode
314 collector P layer
501 power converter
600 power module
700 power module
701 spacer
702 second insulating substrate
703 second heat radiation base
C capacitor
GD1 to GD6 gate drive circuit
PM1 to PM6 power module
VCC power supply voltage

The invention claimed is:

1. A power module, comprising:
an IGBT formed on an N-type first substrate made of SiC;
a diode formed on an N-type second substrate made of SiC;
a first resin layer that covers a surface of the first substrate;
a second resin layer that covers a surface of the second substrate;
a first portion of a silicone gel that covers the surface of the first substrate including a surface of the first resin layer; and
a second portion of the silicone gel that covers the surface of the second substrate including a surface of the second resin layer, wherein
a film thickness of the first resin layer is larger than a thickness of the first substrate.

2. The power module according to claim 1, wherein
an absolute maximum rating of voltage of the IGBT between a collector and an emitter is 6.5 kV or more.

3. The power module according to claim 1, wherein
the film thickness of the first resin layer is larger than a film thickness of the second resin layer.

4. The power module according to claim 1, wherein
the thickness of the first substrate is 200 μm or less.

5. The power module according to claim 1, wherein
a cathode electrode of the diode is electrically short-connected with a collector electrode of the IGBT, and an anode electrode of the diode is electrically short-connected with an emitter electrode of the IGBT.

6. The power module according to claim 1, wherein
the first resin layer covers at least an electric field relaxation region of the first substrate, and the second resin layer covers at least an electric field relaxation region of the second substrate.

7. A power converter, comprising:
the power module according to claim 1.

* * * * *